United States Patent [19]

Janko et al.

[11] Patent Number: 4,774,642
[45] Date of Patent: Sep. 27, 1988

[54] ILLUMINATED ARTICLE

[76] Inventors: Michael Janko, 2600 Werner, Richmond, Mich. 48062; Matthew McAllister, 7343 Maplewood, Lexington, Mich. 48450

[21] Appl. No.: 897,192

[22] Filed: Aug. 15, 1986

[51] Int. Cl.⁴ ............................................. F21L 15/14
[52] U.S. Cl. ................................... 362/108; 362/103; 362/800; 362/806
[58] Field of Search ............... 362/104, 103, 108, 186, 362/806, 800

[56] References Cited

U.S. PATENT DOCUMENTS

| | | | |
|---|---|---|---|
| 3,641,333 | 2/1972 | Gendron | 362/108 |
| 4,164,008 | 8/1979 | Miller et al. | 362/103 |
| 4,451,871 | 5/1984 | Kirkley et al. | 362/186 |
| 4,480,293 | 10/1984 | Wells | 362/108 |
| 4,523,258 | 6/1985 | Morse et al. | 362/108 |
| 4,570,206 | 2/1986 | Deutsch | 362/103 |

FOREIGN PATENT DOCUMENTS 383620  2/1931  United Kingdom ............... 362/108

*Primary Examiner*—Stephen F. Husar
*Attorney, Agent, or Firm*—Basile & Hanlon

[57] ABSTRACT

An illuminated article in the form of a garment or article of wearing apparel includes an electrically conductive harness mounted at predetermined locations on the outer surface of the garment. The harness includes a housing which receives a plurality of illumination devices, such as light emitting diodes. A pair of electrical conductors mounted in an elongated strip are securable within the housing in engagement with the leads of the light emitting diodes. In one embodiment, a removable cap is insertable into the housing for connecting the electrical conductors with the leads of the illumination devices. A cover member is attached to the garment and forms a slot on the outer surface of the garment into which the harness is inserted. An electrical power source including a battery and an on/off switch is also mounted in the article and receives one end of the electrical conductors in the harness to connect the illumination devices to the battery for selectively illuminating the illumination devices. In another embodiment, a separate housing is provided for each illumination device which receives each illumination device in a snap-fit connection. The electrical conductors extend through the housings and are electrically connected to each illumination device. A plurality of harnesses may be mounted on the article and interconnected by a connector which connects the electrical conductors in each harness together.

6 Claims, 4 Drawing Sheets

ILLUMINATED ARTICLE

BACKGROUND OF THE INVENTION

1. Field of the Invention

The present invention relates, in general, to illuminated articles and, more specifically, to illuminated garments and other articles of wearing apparel.

2. Description of the Prior Art

Illuminated articles, such as sweatshirts, jackets, t-shirts, belts, etc., have been previously provided with a number of lights, such as LEDs, which are mounted on each article, and connected to an electrical circuit housed within or mounted on the article of wearing apparel. The circuit includes a power source, such as a battery, which is also mounted on the article of wearing apparel.

Such illuminated articles are used for decorative purposes, or to embellish a particular design formed on the garment or wearing apparel. Also, such articles have been used as safety indicators for joggers, runners, walkers, cyclists, etc., to illuminate the wearer in night or low light conditions for approaching vehicles.

Typically, a battery pack is mounted within the article or garment and connected by a flexible electrical circuit board attached to the garment in a pre-determined design or shape on the garment. A number of LEDs, are electrically connected to the circuit board and, typically, protrude through apertures formed in the outer surface of the garment for ease of visibility.

Thus, the LEDs are fixed in a pre-set location on the garment. Also, the LEDs and the attached circuit board and battery pack are not able to be easily removed from the garment for cleaning or washing of the garment. Further, it is difficult if not impossible to produce a flexible mylar circuit board capable of carrying and activating illuminatable device.

In order to improve upon and overcome the deficiencies in the previously devised illuminated articles of wearing apparel, it would be desirable to provide an illuminated article, preferably an article of wearing apparel or a garment, in which the illumination devices, such as LEDs, are easily re-positionable in any design or location on the garment. It would also be desirable to provide an illuminated article in which the illuminating devices are easily attachable to an electric circuit or harness and power source housed wihtin the garment or article. It would also be desirable to provide an illuminated article in which the entire electrical circuit including the power supply, illumination devices and conductors are removable from the garment to enable the garment to be cleaned or washed. It would also be desirable to provide an illuminated article in which the illumination devices are not visible when they are not activated. Finally, it would be desirable to provide an illuminated article in which the illumination circuit mountable on the article or garment provides an aesthetically pleasing appearance when the illumination devices are not activated.

SUMMARY OF THE INVENTION

The present invention is an illuminated article, preferably an illuminated garment or article of wearing apparel. An electrically conductive harness means is mounted on the article or garment at any desired location. The harness means includes a housing having an elongated bore formed in the upper surface thereof which receives a plurality of illumination means, such as light emitting diodes (LEDs). The LEDs preferably have a low height or profile and include two contacts or leads.

A pair of electrical conductors are mounted in the housing with slots cut through the upper surface of the housing to place the contacts or leads of the LEDs in electrical contact with the conductors. In one embodiment, a cap is inserted into a slot formed in the bottom surface of the housing to provide a spring pressure on the base or substrate to provide secure contact between the electrical conductors in the base and the leads of the LEDs. Also, the cap forms a flat back surface in the housing to prevent discomfort to the wearer of the garment. In another embodiment, the housing is formed with a solid base and receives the LEDs in a snap-in fit connection through the open top end of the bore in the housing.

A cover member formed of a transparent or semi-transparent material is attached at its outer edges to the garment at any desired location or in any configuration on the garment. The cover member forms a slot between itself and the outer surface of the garment which slidably receives the harness means. This enables the harness to be easily removed from the garment for cleaning or washing of the garment.

The present illuminated article, which is particularly suited for illuminating portions of garments or other articles of wearing apparel, overcomes many of the problems encountered with previously devised illuminated articles or wearing apparel. For one, the illumination devices, such as LEDs, do not protrude through the exterior surface of the garment. Rather, the illumination means and the attached electrical circuit are housed beneath a cover member attached to the outer surface of the garment. This provides a pleasing, aesthetic look to the garmet. Also, forming the cover means from a transparent or semi-transparent material effectively hides the illumination devices and harness from view when such devices are not illuminated. Thus, the garment can be worn normally during daylight hours when the illumination devices are not required or activated and still provide a pleasing appearance. Furthermore, attaching the separate cover member to the outer surface of the garment which forms a slot to receive the electrical harness and LEDs, enables the harness and atttached LEDs to be easily removed for cleaning of the garment. This has not been previously provided in other illuminated articles or wearing apparel.

BRIEF DESCRIPTION OF THE DRAWINGS

The various uses, advantages and other features of the present invention will become more apparent by referring to the following detailed description and drawing in which.

DESCRIPTION OF THE PREFERRED EMBODIMENTS

Figure 1:
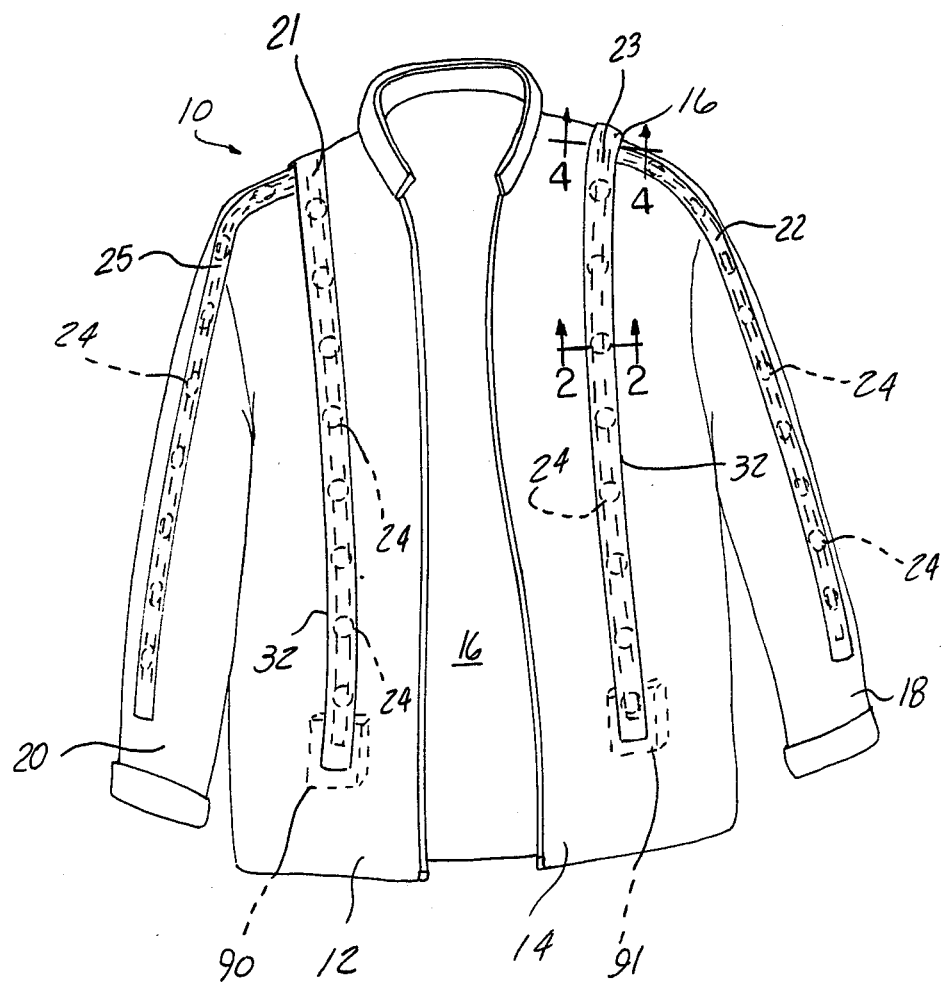
FIG. 1 is a perspective view of an article having the illumination device of the present invention mounted thereon.

Throughout the following description and drawing, an identical reference number is used to refer to the same component shown in multiple figures of the drawing.

The present invention is an illuminated article 10, such as, for example, a garment or article of wearing apparel. Such a garment or article of wearing apparel 10 can be a sweatshirt, t-shirt, jacket, belt, etc. Although a jacket is described and illustrated in the present invention, it will be understood that it is by way of example only and that the present invention may be employed in other articles even if such articles are not garments or wearing apparel.

Referring to FIG. 1, the illuminated article 10 is illustrated as comprising a jacket having two front surfaces 12 and 14, a back 16 and two spaced sleeves 18 and 20. The jacket 10 may have any form or shape.

A plurality of illumination devices 24 are mounted at predetermined, spaced positions in electrically conductive harnesses 21, 22, 23 and 25 attached in any desired form on the jacket 10. The harnesses 21, 22, 23 and 25 may be positioned at any position on the front surfaces 12 and 14, the sleeves 18 and 20 or the back 16 of the jacket 10 as desired for the particular application of this invention. By way of example, harnesses 21 and 23 are mounted on the front and back surfaces of the jacket 10 and harnesses 22 and 25 are mounted or attached to the sleeves 18 and 20 of the jacket 10.

Preferably, the illumination device 24 comprise light emitting diodes or LEDs. Any conventional LED may be employed; however, LEDs having a low height or profile, such as one manufactured by the Tandy Corporation, Model No. 276-033, are preferred for use in this illuminated article 10.

Figure 2:
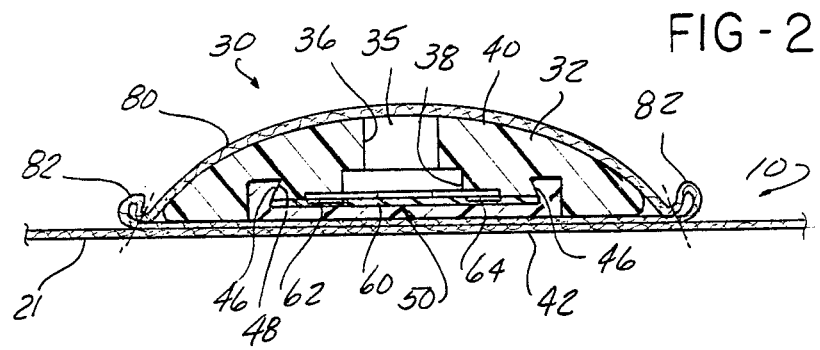
FIG. 2 is a cross-sectional view generally taken along line 2—2 in FIG. 1.
Figure 3:
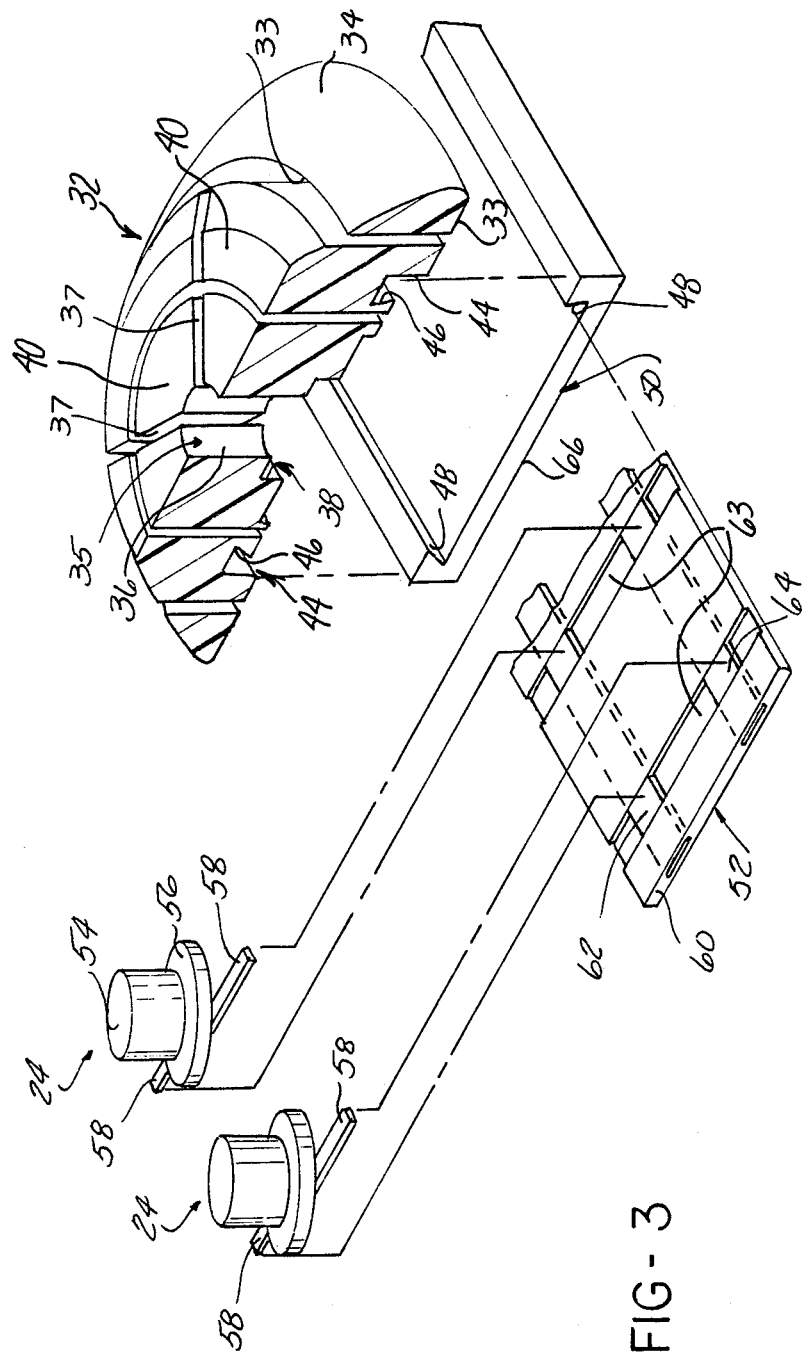
FIG. 3 is an enlarged, exploded, perspective view of one embodiment of the harness means employed in the present invention.

The illumination devices or LEDs 24 are electrically connected to the harnesses 21, 22, 23 and 25, as shown for the harness 21 in FIGS. 2 and 3. The harness 21, which is constructed identical to the harnesses 22, 23 and 25, includes a housing 32 formed of a flexible plastic material. Preferably, the plastic material has a light color, such as white, to minimize its visibility when the illumination devices 24 housed therein are de-activated.

The housing 32 may be in any shape, such as an elongated strip or individual members. However, it is preferred that the housing 32 be formed of separate members 32 as shown in FIG. 1. This minimizes the weight of the harness and provides a more comfortable feel for the wearer.

Each housing 32 preferably has a circular form in the plan view as shown in FIG. 3, a flat base 33, inwardly tapering outer side walls 34 and apertures 37. Each housing 32 also includes a slot 35 having a first upper section 36 and an enlarged lower section 38. The first and second sections 36 and 38 are configured to slidably receive one of the LEDs 24. The bottom edge of the enlarged lower section 38 communicates with a second slot 44 extending outward from the center of the housing 32. The tunnel of translucent material 42 receives the electrically conductive harness 21.

The inwardly extending edges 46 of the slot 44 receive the inverted edges 48 of a cap member 50 to enable the cap member 50 to be snapped into engagement with the housing 32 after the electrical conductor assembly 52 is inserted therein.

As shown in FIG. 3, the illumination devices or LEDs 24 include an illuminatable portion 54 and a base 56. In the embodiment shown in FIG. 3, the pair of contacts or leads 58 extend horizontally outward from opposite the sides of the base 56. This configuration for the contacts 58 enables the illumination devices 24 to be slid into the slot 35 in the housing 32, with the upper surface of the illuminatable portion 54 of the LED 24 being disposed in substantial congruity with the upper surface 40 of the housing 32. This provides a smooth outer surface on the housing 32.

The electrical conductor assembly 52 includes a rectangularly shaped, elongated strip 60 preferably formed of an electrically insulating material, such as polyvinyl chloride or other suitable electrical insulator material. A pair of spaced, elongated conductors 62 and 64 are mounted longitudinally within the strip 60 and are completely surrounded by the strip 60. The conductors 62 and 64 are spaced apart a short distance within the strip 60 to receive the separate leads 58 from the LEDs 24. Slots 63 as shown in FIG. 3 are formed in the upper surface of the strip 60 to expose the upper surfaces of the conductors 62 and 64 at the locations where it is desired to mount one of the LEDs 24 on the strip 60. Each of the slots 63 also prevents rotation of the LEDs 24 once the LEDs 24 are mounted in the conductor assembly 52.

The electrically conductive strip 52 fits with in the slot 44 in the housing 32 prior to attachment of the cap member 50 to the housing 32 in this embodiment of the invention. This places the conductors 62 and 64 in electrical contact with the leads 58 of each illumination device 24. The cap 50, due to its inwardly extending edges 48, provides a spring-like biasing force on the electrically conductive strip 52 which maintains the conductors 62 and 64 in secure engagement with the leads 58 of each LED 24 as well as mounting the electrically conductive strip 52 and the LEDs 24 within the housing 32.

Figure 4:
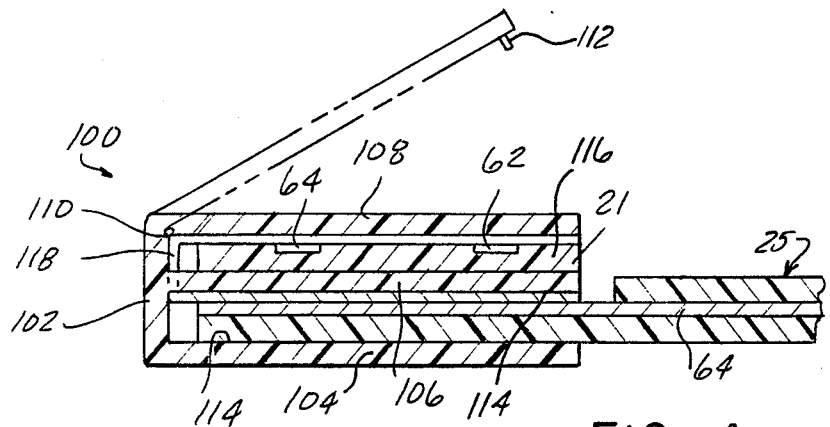
FIG. 4 is an enlarged cross-sectional view generally taken along line 4—4 in FIG. 1.

Referring now to FIG. 4, there is shown the interconnection of the harnesses 22 and 25 in the sleeves 18 and 20, respectively, of the jacket with the front to back extending harnesses 23 and 21, respectively.

The connecting means denoted in general by reference number 100 comprises a connector mounted in the shoulder portion of the jacket 10. The connector 100 is in the form of a single piece body having a base 102 integrally connected with spaced legs 104 and 106, and an upper leg 108 which is hingedly attached at a bottom end 110 to the base 102. The upper leg 108 is movable between a first position parallel to and spaced from the intermediate leg 106 and an upwardly disposed position shown in phantom in FIG. 4 which enables the insertion of the harness 21 into a slot formed in the connector 100.

As shown in FIG. 4, the upper leg 108 is provided with a pin or notch 112 which fits into a suitably formed recess in the connector or harness 21 for securing the harness 21 and the connector 100 together.

The three spaced legs 104, 106 and 108 define a pair of spaced slots 114 and 116 which respectively receive a bared end of the harness 21 exposing both conductors 62 and 64 in the harness 21 and a cut out or slot in the harness 21. As shown in FIG. 4, the top surface of the harness 21 is bared to expose the conductors 62 and 64. Likewise, a window or slot, similar to that slot 63 shown in FIG. 3, is formed intermediately on the harness 21 exposing the upper surface of the conductors 64 and 62. This enables the conductors 64 and 62 of each of the harnesses 21 and 25 to be placed in electrical contact with a U-shaped electrically conductive contact or terminal 118 which is bonded or otherwise mounted within the connector 100. The terminal 118 provides electrical connection between conductors of the two harnesses 21 and 25 and the power sources 90 and/or 91.

As shown in FIG. 2, a cover member 80 is attached to the outer surface of the garment 10 to provide a slot for the housing 32. Preferably, the cover member 80 is formed of a transparent or at least a semi-transparent material which will enable the light from the illumination devices 24 to be viewed therethrough when illuminated, but will completely cover these devices from view when they are not illuminated. The cover member 80 is attached at its side edges to the outer surface of the garment 10 by means of stitching or other attachment methods. In a preferred embodiment, a bead 82 of a light reflective material is formed on the edges of the stitched portions of the cover member 80.

Figure 5:
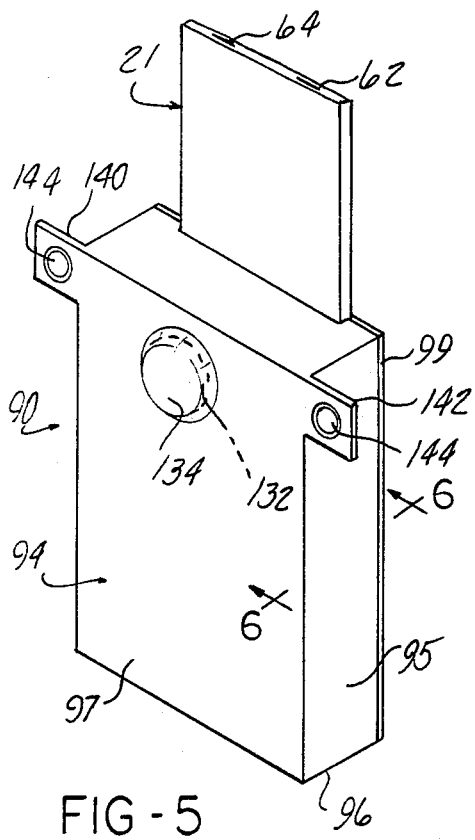
FIG. 5 is a perspective view of the electrical power source employed in the present invention.
Figure 6:
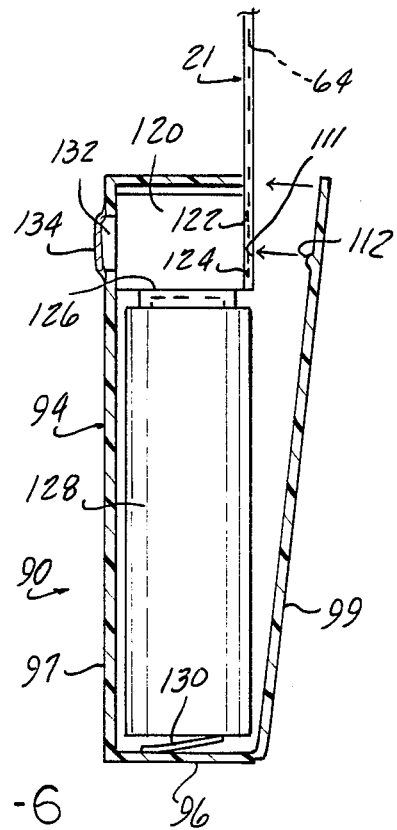
FIG. 6 is a cross-sectional view generally taken along line 6—6 in FIG. 5.

As shown generally in FIG. 1 by reference number 90 and in greater detail in FIGS. 5 and 6, the illuminated article 10 is provided with an electrical power source 90, such as a conventional battery or batteries 128. The electrical power source 90 may include one or more conventional storage batteries 128 mounted within a housing 94 as shown in greater detail in FIGS. 5 and 6 which is, in turn, mounted within a pouch formed in the interior of the jacket 10, such as within the front panels 12 and 14 as shown in FIG. 1. The electrical power source 90 includes a housing 94 formed of opposed side walls 95, a bottom wall 96, a front wall 97 and a hinged back wall 99. The back wall 99 is, preferably, connected by means of a living hinge at its lower end to the bottom wall 96 of the housing 94. A projection 112 is mounted on the upper portion of the back wall 99 and is removably insertable in a snap-type fit into a correspondingly-shaped recess 111 in the harness 1. This not only secures the harness 21 in electrical contact with the power source and the harness 22; but also enables both harnesses 21 and 22 to be easily removed from the garment 10 when it is necessary to clean the garment 10.

the housing 94 also supports an electrical switch 120 which is mounted within the housing 94 and includes two terminals 122 and 124 mounted on a back surface thereof. The contacts 122 and 124 are connectable with the conductors 62 and 64 in the harness 21. The switch 120 also includes battery terminals denoted generally by reference number 126 mounted on a bottom side which is connectable to the batteries 128. A single battery 128 or a pair of batteries may be employed depending upon the voltage requirements of the illuminated article of this invention. A biasing means 130 is mounted on the bottom wall 96 of the housing 94 for biasing the batteries 128 upward into engagement with the switch 120 and the terminals 126. This may be in the form of a conventional leaf spring mounted on the base 96 at one end and angled upward into contact with the battery 128.

The switch 120 is provided with a push button 132 mounted on a front surface thereof and extending outward through the front wall 97 of the housing 94. The push button 132 is covered by a moisture-proof covering 134 which seals the interior electrical components of the switch 120. This enables the push button 132 to be activated by the wearer of the illuminated article 10 through the surface of the outer garment.

Means are also provided for mounting the housing 94 to the garment 10. As shown in FIG. 5, a pair of outwardly extending flanges 140 and 142 are integrally formed on the outwardly extending surface 97 of the housing 94. Conventional snap fasteners 144 are mounted on the outward surface of the flanges 140 and 142 to enable the housing 94 to be attached to the corresponding snap-on fasteners mounted interiorly in a pouch or pocket on an inside surface of the garment 10 as shown in FIG. 1. This securely mounts the electrical power source 90 and/or 91 in the garment 10 as well as enabling its easy removal when it is desired to clean the garment 10.

It should be understood that the illuminated article 10 of the present invention includes at least one electrical power source 90. An additional power source 91 as shown in FIG. 1, may also be employed when the configuration of the harnesses 21, 22, 23 and 25 are such as to form two separate circuits on the garment. It is also possible to employ a single power source, such as power source 90, when the harnesses on the front, back and sleeve portions of the garment are interconnected by an intermediately extending harness which may be, for example, mounted horizontally or in any other desired position across the back portion of the garment between the harnesses 21 and 23. Such a harness would be attached by connectors similar to connector 100 shown in FIG. 4.

Figure 7:
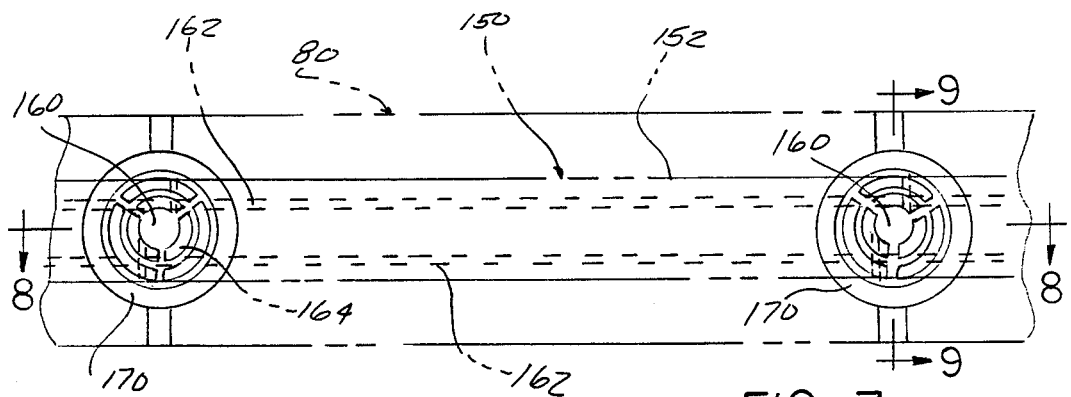
FIG. 7 is a plan view of another embodiment of the harness means of the present invention.
Figure 8:
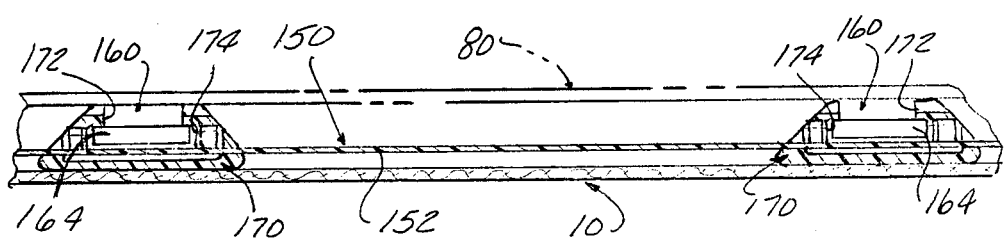
FIG. 8 is a cross-sectional view generally taken along line 8—8 in FIG. 7.
Figure 9:
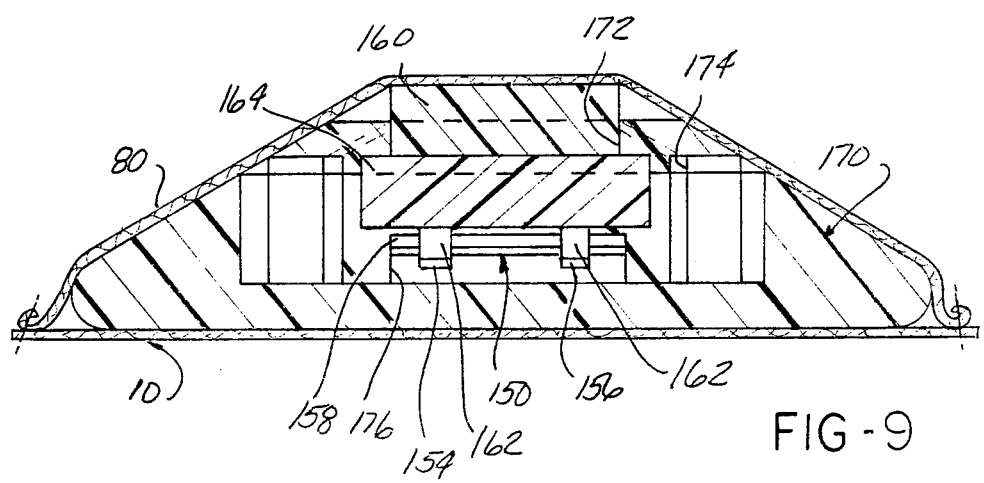
FIG. 9 is a cross-sectional view, generally taken along line 9—9 in FIG. 7 and showing another embodiment of the harness means.

Referring now to FIGS. 7, 8 and 9, another embodiment of the harness employed in the illuminated article 10 of the present invention is depicted. The harness 150 is substantially identical to the harnesses 21, 22, 23 and 25 shown in FIG. 1 and described above but with minor differences therebetween in the housing as formed to receive the illumination device or LEDs 24. As shown in FIGS. 7, 8 and 9, the harness 150 includes an elongated strip 152 having a pair of spaced conductors 154 and 156 formed in the same manner as the conductive strips 60 shown in FIG. 3. Slots 158 are formed at selected various locations along the length of the strip 152 to expose the upper surfaces of the conductors 154 and 156 for connection to the leads or contacts of the LEDs 24.

In this embodiment, the illumination devices 24, again LEDs, have a low profile or height and include a pair of contact pads 162 extending outward from a base 164. The contact pads 162 engage the conductors 154 and 156 in the conductive strip 152 to provide power to the LED 24 when the power source is activated.

Each LED is mounted in a housing 170 which in the preferred embodiment, has a circular plan shape. Each housing 170 is formed with a centrally located cutout portion having a first, small diameter slot 172, an enlarged outer slot 174 and a horizontal extending through slot 176. The central and outer slots 172 and 174 receive an LED 160 in a snap-in fit for removably but securely mounting each LED 160 in the housing 170. The lower slot 176 is configured to receive the electrically conductive strip 152 which interconnects the various spaced housing 170 to enable insertion and removal of the entire harness 150 in the manner described above.

It should be understood that additional slots 158 may be formed at other locations along the length of the conductive strip 152 for insertion of additional housings 170 and LEDs 160 in other desired positions if the wearer of the illuminated article of the present invention desires to change the position or add additional illumination devices to the garment 10.

The illuminated article of the present invention overcomes many of the deficiencies encountered with previously devised illuminated articles specifically designed for use as wearing apparel or garments in that the entire illumination circuit or electrical harness may be easily removed to enable the article to be cleaned. The illuminated article is also formed to provide an aesthetically pleasing appearance on the garment when the illumination circuit is no activated.

What is claimed is:

1. An illuminated object having an outer surface comprising:
   at least one layer of translucent material;
   an electrical power source mounted on the object;
   harness means mountable on the object and electrically connectable to the electric power source, the harness means including:
   a housing wherein the housing includes:
   (a) a bore formed in the housing for removably receiving the illumination means;
   (b) a slot formed in the housing communicating with the bore for receiving the pair of electrical conductors; and
   (c) cap means removably emplaceable in the housing for closing the slot in the housing and biasing the electrical conductors into electrical contact with the illumination means;
   a pair of electrical conductors connectable to the electric power source and mountable in the housing; and
   illumination means mountable in the housing in electrical contact with the pair of electrical conductors.

2. The illuminated object of claim 1 wherein the electrical conductors are mounted in flexible strip.

3. The illuminated object of claim 2 wherein the source of electrical power comprises:
   a battery;
   a housing for the battery;
   means for connecting the battery to the electrical conductors in the harness means; and
   manually operable switch means mounted in the housing for electrically connecting the battery to the electrical conductors for the flow of electrical power thereto.

4. An illuminated object having an outer surface comprising:
   at least one layer of translucent material;
   an electric power source mounted on the object;
   harness means mountable on the object and electrically connectable to the electric power source, the harness means including:
   (a) a housing;
   (b) a pair of electrical conductors connectable to the electric power source and mountable in the housing; and
   (c) illumination means mountable in the housing in electrical contact with the pair of electrical conductors; and
   means for interconnecting the electrical conductors of each harness means to form a parallel electrical circuit between the illumination means and the electrical power source,
   wherein the interconnecting means comprises:
   (a) a member having a pair of spaced slots;
   (b) a U-shaped, electrically conductive terminal mounted on the body on opposed faces of the slots of the body, the terminal being electrically engageable with the conductors in the harness; and
   (c) a cover formed on the body member removably engageable with one of the harness means to enable insertion and securement of one of the harness means into the body member.

5. An illuminated object having an outer surface comprising:
   at least one layer of translucent material;
   an electrical power source mounted on the object;
   harness means mountable on the object and electrically connectable to the electric power source, the harness means including:
   a housing, the housing having a continuous base extending between opposed side walls wherein the housing is snap-fit or slotted and cap means forming a flat back surface in the housing to prevent discomfort to the wearer;
   a pair of electrical conductors connectable to the electric power source and mountable in the housing; and
   illumination means mountable in the housing in electrical contact with the pair of electrical conductors, the illumination means being removably insertable into a receptacle in the housing and coming in contact with the pair of electrical conductors.

6. The illuminated object of claim 5 further including aesthetically pleasing slot means formed in the housing for enabling removable emplacement of the illumination means into the housing.

* * * * *